(12) United States Patent
Littau et al.

(10) Patent No.: US 6,429,930 B1
(45) Date of Patent: Aug. 6, 2002

(54) DETERMINATION OF CENTER OF FOCUS BY DIFFRACTION SIGNATURE ANALYSIS

(75) Inventors: Michael E. Littau; Christopher J. Raymond, both of Albuquerque, NM (US)

(73) Assignee: Accent Optical Technologies, Inc., Bend, OR (US)

( * ) Notice: Subject to any disclaimer, the term of this patent is extended or adjusted under 35 U.S.C. 154(b) by 0 days.

(21) Appl. No.: 09/946,104

(22) Filed: Sep. 4, 2001

Related U.S. Application Data
(60) Provisional application No. 60/230,491, filed on Sep. 6, 2000.

(51) Int. Cl.[7] .................................................. G01B 9/00
(52) U.S. Cl. ....................................................... 356/124
(58) Field of Search ................................. 356/124–127

(56) References Cited

U.S. PATENT DOCUMENTS

| | | | |
|---|---|---|---|
| 4,710,642 A | | 12/1987 | McNeil |
| 4,759,626 A | * | 7/1988 | Kroko ........................ 356/124 |
| 4,863,548 A | | 9/1989 | Lee |
| 4,920,273 A | | 4/1990 | Sacks et al. |
| 5,044,750 A | | 9/1991 | Shamble |
| 5,164,790 A | | 11/1992 | McNeil et al. |
| 5,241,369 A | | 8/1993 | McNeil et al. |
| 5,266,790 A | | 11/1993 | Markle et al. |
| 5,703,692 A | | 12/1997 | McNeil et al. |
| 5,712,707 A | | 1/1998 | Ausschnitt et al. |
| 5,867,276 A | | 2/1999 | McNeil et al. |
| 5,877,860 A | | 2/1999 | Borden |
| 5,889,593 A | | 3/1999 | Bareket |
| 5,912,741 A | | 6/1999 | Carter et al. |
| 5,952,132 A | | 9/1999 | King et al. |
| 5,953,128 A | | 9/1999 | Ausschnitt et al. |
| 6,005,669 A | | 12/1999 | Pahk et al. |
| 6,088,113 A | | 7/2000 | Kim |
| 6,100,985 A | | 8/2000 | Scheiner et al. |

OTHER PUBLICATIONS

Niu, X., et al., "Specular spectroscopic scatterometry in DUV lithography", *Proc. SPIE Metrology, Inspection, and Process Control for Microlithography XIII* , Mar., 1999, pp. 159–168, vol. 3677, SPIE, Santa Clara, California.

Bao, J. et al., "A Focus Test based on Scatterometry", Slide Presentation, *http://www.bcam.berkeley.edu/archive/ilp98/junwei/1.html*, Mar. 1998, Berkeley Computer Aided Manufacturing, University of California at Berkeley, Berkeley, CA. pp. 1–8.

Niu, X., et al., "In–Situ Sensing by Specular Spectroscopic Scatterometry", Slide Presentation, *http://www.bcam.eecs.berkeley.edu/archive/ilp98/junwei/1.html*, Mar., 1998, Berkeley Computer Aided Manufacturing, University of California at Berkeley, Berkeley, CA., pp. 1–8.

Niu, X., et al., "Specular spectroscopic scatterometry in DUV lithography", Proc. SPIE Metrology, Inspection, and Process Control for Microlithography XIII, Jun., 1999, pp. 159–168, vol. 3677, The International Society for Optical Engineering ABSTRACT.

Raymond, Christopher J., "Angle–resolved scatterometry for seminconductor manufacturing", Microlithography World, Winter 2000, pp. 18–23.

* cited by examiner

Primary Examiner—Frank G. Font
Assistant Examiner—Amanda Merlino
(74) Attorney, Agent, or Firm—Stephen A. Slusher

(57) ABSTRACT

The present invention provides methods for determination of parameters in lithographic devices and applications by diffraction signature difference analysis, including determination of center of focus in lithography devices and applications.

47 Claims, 9 Drawing Sheets

DETERMINATION OF CENTER OF FOCUS BY DIFFRACTION SIGNATURE ANALYSIS

CROSS-REFERENCE TO RELATED APPLICATIONS

This application claims the benefit of the filing of U.S. Provisional Patent Application Ser. No. 60/230,491, entitled Determination Of Center Of Focus By Diffraction Signature Analysis, filed on Sep. 6, 2000, and the specification thereof is incorporated herein by reference.

BACKGROUND OF THE INVENTION

1. Field of the Invention (Technical Field)

The present invention relates to methods for determination of parameters in lithography applications by diffraction signature analysis, including determination of center of focus in lithography applications, such as for photoresist lithographic wafer processing.

2. Background Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

Lithography has a variety of useful applications in the semiconductor, optics and related industries. Lithography is used to manufacture semiconductor devices, such as integrated circuits created on wafers, as well as flat-panel displays, disk heads and the like. In one application, lithography is used to transmit a pattern on a mask or reticle to a resist layer on a substrate through spatially modulated light. The resist layer is then developed and the exposed pattern is either etched away (positive resist) or remains (negative resist) to form a three dimensional image pattern in the resist layer. However, other forms of lithography are employed in addition to photoresist litholography.

In one form of lithography, particularly used in the semiconductor industry, a wafer stepper is employed, which typically includes a reduction lens and illuminator, an excimer laser light source, a wafer stage, a reticle stage, wafer cassettes and an operator workstation. Modern stepper devices employ both positive and negative resist methods, and utilize either the original step-and-repeat format or a step-and-scan format, or both.

Exposure and focus determine the quality of the image pattern that is developed, such as in the resist layer utilizing photoresist lithography. Exposure determines the average energy of the image per unit area and is set by the illumination time and intensity. Focus determines the decrease in modulation relative to the in-focus image. Focus is set by the position of the surface of the resist layer relative to the focal plane of the imaging system.

Local variations of exposure and focus can be caused by variations in the resist layer thickness, substrate topography, as well as stepper focus drift. Because of possible variations in exposure and focus, image patterns generated through lithography require monitoring to determine if the patterns are within an acceptable tolerance range. Focus and exposure controls are particularly important where the lithographic process is being used to generate sub-micron lines.

A variety of methods and devices have been used to determine focus of stepper and similar lithography devices. Scanning electron microscopes (SEM) and similar devices are employed. However, while SEM metrology can resolve features on the order of 0.1 microns, the process is costly, requires a high vacuum chamber, is relatively slow in operation and is difficult to automate. Optical microscopes can be employed, but do not have the required resolving power for sub-micron structures. Other methods include the development of specialized targets and test masks, such as are disclosed in U.S. Pat. Nos. 5,712,707, 5,953,128, and 6,088,113. Overlay error methods are also known, as disclosed in U.S. Pat. No. 5,952,132. However, these methods, while increasing resolution because of the nature of the targets, still require use of SEM, optical microscopes or similar direct measurement devices.

A variety of scatterometer and related devices and measurements have been used for characterizing the microstructure of microelectronic and optoelectronic semiconductor materials, computer hard disks, optical disks, finely polished optical components, and other materials having lateral dimensions in the range of tens of microns to less than one-tenth micron. For example, the CDS200 Scatterometer, made and sold by Accent Optical Technologies, Inc. is a fully automated nondestructive critical dimension (CD) measurement and cross-section profile analysis system, partially disclosed in U.S. Pat. No. 5,703,692. This device can repeatably resolve critical dimensions of less than 1 nm while simultaneously determining the cross-sectional profile and performing a layer thickness assessment. This device monitors the intensity of a single diffraction order as a function of the angle of incidence of the illuminating light beam. The intensity variation of the $0^{th}$ or specular order as well as higher diffraction orders from the sample can be monitored in this manner, and this provides information that is useful for determining the properties of the sample target which is illuminated. Because the process used to fabricate the sample target determines the properties of a sample target, the information is also useful as an indirect monitor of the process. This methodology is described in the literature of semiconductor processing. A number of methods and devices for scatterometer analysis are taught, including those set forth in U.S. Pat. Nos. 4,710,642, 5,164,790, 5,241,369, 5,703,692, 5,867,276, 5,889,593, 5,912,741, and 6,100,985.

Scatterometers and related devices can employ a variety of different methods of operation. In one method, a single, known wave-length source is used, and the incident angle $\Theta$ is varied over a determined continuous range. In another method, a number of laser beam sources are employed, optionally each at a different incident angle $\Theta$. In yet another method, an incident broad spectral light source is used, with the incident light illuminated from some range of wavelengths and the incident angle $\Theta$ optionally held constant. Variable phase light components are also known, utilizing optics and filters to produce a range of incident phases, with a detector for detecting the resulting diffracted phase. It is also possible to employ variable polarization state light components, utilizing optics and filters to vary the light polarization from the S to P components. It is also possible to adjust the incident angle over a range $\Phi$, such that the light or other radiation source rotates about the target area, or alternatively the target is rotated relative to the light or other radiation source. Utilizing any of these various devices, and combinations or permutations thereof, it is possible and known to obtain a diffraction signature for a sample target.

Besides scatterometer devices, there are other devices and methods capable of determining the diffraction signatures at the $0^{th}$ order or higher diffraction orders using a light-based source that can be reflected off of or transmitted through a diffraction grating, with the light captured by a detector. These other devices and methods include ellipsometers and reflectometers, in addition to scatterometers. It is further known that non-light-based diffraction signatures may be obtained, using other radiation sources as, for example, X-rays.

A variety of sample targets are known in the art. A simple and commonly used target is a diffraction grating, essentially a series of periodic lines, typically with a width to space ratio of between about 1:1 and 1:3, though other ratios are known. A typical diffraction grating, at for example a 1:3 ratio, would have a 100 nm line width and a 300 nm space, for a total pitch (width plus space) of 400 nm. The width and pitch is a function of the resolution of the lithographic process, and thus as lithographic processes permit smaller widths and pitches, the width and pitch may similarly be reduced. Diffraction techniques can be employed with any feasible width and pitch, including those substantially smaller than those now typically employed.

Diffraction gratings are typically dispersed, in a known pattern, within dies on a wafer. It is known in the art to employ multiple dies (or exposure fields) on a single wafer. Each diffraction pattern may be made by lithographic means to be at a different focus, such as by employing a different focus setting or a different exposure setting or dose. It is also known that center of focus may be determined using scatterometry and diffraction gratings by comparing diffraction signatures from a variety of different focus diffraction gratings to a theoretical model library of diffraction grating signatures yielding information regarding CD. The actual diffraction measures are compared to the model, from which CD values are derived. The CD value thus obtained is plotted against focus and the results fit to a parabolic curve. However, this method requires significant time and computer resources to generate the theoretical model.

SUMMARY OF THE INVENTION (DISCLOSURE OF THE INVENTION)

The present invention provides a method of measuring parameters relating to a lithography device utilizing the steps of providing a substrate comprising a plurality of diffraction gratings formed on the substrate by lithographic process utilizing the lithography device, the diffraction gratings comprising a plurality of spaced elements; measuring a diffraction signature for at least three of the plurality of diffraction gratings by means of a radiation source-based tool; and determining the differences between the diffraction signatures to determine a desired parameter of said lithography device. In this method, the substrate can include a wafer.

The method can further include forming the plurality of diffraction gratings utilizing the lithography device at different known focus settings, and determining the two adjacent focus setting diffraction gratings wherein the difference between the diffraction signatures is less than the difference of the diffraction signatures between other adjacent focus setting diffraction gratings, whereby the parameter is the center of focus of the lithography device.

In a preferred embodiment, the different known focus settings are equal increment different focus settings. Alternatively, the different known focus settings are non-equal increment different focus settings, and the method further includes use of a mathematical algorithm to normalize the non-equal increment different focus settings.

The method further includes plotting the diffraction signature differences, wherein the difference in diffraction signatures between diffraction gratings increases as an approximation of a parabolic curve with a slope of zero over the center of focus. Determination of the difference in diffraction signatures between diffraction gratings can also include use of a metric. One metric that may be employed is a root mean square error method of data analysis. Determining the minimal difference can further include comparing the weighted averages of differences of diffraction signatures between diffraction gratings.

In one embodiment of the method, the method further includes forming a plurality of diffraction gratings utilizing the lithography device at the same focus setting and determining the differences as a function of the location of the diffraction gratings on the substrate. In another embodiment of the method, the method further includes forming the plurality of diffraction gratings at different known focus settings and different known dose settings and determining the effect of dose on focus. The plurality of diffraction gratings can include sets of the same known different focus setting diffraction gratings, the sets varying by different known dose settings.

The invention further provides a method of determining the center of focus in a lithography device, the method including the steps of providing a substrate comprising a plurality of diffraction gratings made utilizing the lithography device, the plurality of diffraction gratings comprising different known focus settings; determining a diffraction signature for at least three of the plurality of diffraction gratings by means of a radiation source-based tool; measuring the differences between the diffraction signatures between adjacent focus setting diffraction gratings; and determining the center of focus as the focus setting wherein there is a minimal difference between the diffraction signatures of adjacent focus setting diffraction gratings.

In one embodiment of this method, the difference in diffraction signatures between adjacent focus setting diffraction gratings increases as an approximation of a parabolic curve with a slope of zero on the minimal difference. Determining the difference in diffraction signatures between adjacent focus setting diffraction gratings can include determination of the difference using a metric, including but not limited to a root mean square error method of data analysis. The method also includes determining the minimal difference by comparing the weighted averages of differences between diffraction signatures of adjacent focus setting diffraction gratings. In yet another embodiment of this method, determining the minimal difference includes fitting data derived from differences between diffraction signatures between adjacent sequential focus setting diffraction gratings to a parabolic curve, whereby the minimal difference encompasses the minima of the parabolic curve.

In all of the foregoing methods, the radiation source-based tool includes light source-based tools. In one embodiment, the light source-based tool includes an incident laser beam source, an optical system focusing the laser beam and scanning through some range of incident angles, and a detector for detecting the resulting diffraction signature over the resulting measurement angles. The light source-based tool can further include an angle-resolved scatterometer. In a different embodiment, the light source-based tool includes a plurality of laser beam sources. In yet another embodiment, the light source-based tool includes an incident broad spectral light source, an optical system focusing the light and illuminating through some range of incident wavelengths, and a detector for detecting the resulting diffraction signature over the resulting measurement wavelengths. In yet another embodiment, the light source-based tool includes an incident light source, components for varying the amplitude and phase of the S and P polarizations, an optical system focusing the light and illuminating over some range of incident phases, and a detector for detecting the phase of the resulting diffraction signature.

In all of the foregoing methods, measuring a diffraction signature includes phase measurement by means of a broad spectral radiation source-based tool source, operating at a fixed angle, a variable angle Θ or a variable angle Φ. In the methods, measuring a diffraction signature also includes phase measurement by means of a single wavelength radiation source-based tool source, operating at a fixed angle, a variable angle Θ or a variable angle Φ. Measuring a diffraction signature can also include phase measurement by means of a multiple discrete wavelength radiation source-based tool source. The diffraction signature can be a reflective diffraction signature or a transmissive diffraction signature. The diffraction signature can be a specular order diffraction signature or a higher order diffraction signature, either positive or negative.

A primary object of the present invention is to provide a method for measuring parameters relating to a lithography device without the use of optical, SEM or similar microscopy metrology tools.

Another object of the present invention is to provide a method for determining center of focus of a lithography device by analyzing the diffraction signature difference between members of a series of different focus diffraction gratings.

Another object of the present invention is to provide a method for determining or measuring parameters associated with a lithography device, including center of focus, by obtaining a diffraction signature utilizing either reflective ortransmissive diffraction.

Another object of the present invention is to provide a method for determining or measuring parameters associated with a lithography device, including center of focus, by obtaining a diffraction signature utilizing any method to create a diffraction signature, including but not limited to reflective or transmissive angle-resolved, variable wavelength, variable phase, variable polarization state or variable orientation diffraction, or a combination thereof, of the $0^{th}$ or specular diffraction order or any higher orders.

Another object of the present invention is to provide a method and device for determining or measuring parameters associated with a lithography device, including center of focus, without requiring direct use of either a theoretical model or library of known parameters.

Another object of the present invention is to provide a method for determining or measuring parameters associated with a lithography device, including center of focus, as a function of dose, by means of diffraction signature difference response and analysis.

Another object of the present invention is to provide a method for determining or measuring parameters associated with a lithography device by means of any order of diffraction signature of different focus diffraction gratings, including the $0^{th}$ or specular order or any higher order diffraction, either positive or negative.

A primary advantage of the present invention is that it permits measuring parameters relating to a lithography device without the use of optical, SEM or similar microscopy metrology tools.

Another advantage of the present invention is that it permits use of a series of different focus diffraction gratings on a conventional wafer made by means of a stepper, including conventional photoresist lithography means, to determine center of focus utilizing determination of diffraction signatures, and the differences therebetween, for the diffraction gratings.

Another advantage of the present invention is that it provides a method and device that permits obtaining results, including center of focus, in a lithography device, such as a stepper, in a shorter period of time and at lower cost than conventional and known methods.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIGS. 1A to 1C is an exploded schematic representation of a wafer with dies thereon, the dies including diffraction gratings; wherein FIG. 1A depicts the wafer, FIG. 1B depicts a die on the wafer of FIG. 1A, and FIG. 1C depicts a diffraction grating array on the die of FIG. 1B;

DESCRIPTION OF THE PREFERRED EMBODIMENTS

BEST MODES FOR CARRYING OUT THE INVENTION

Figure 1:
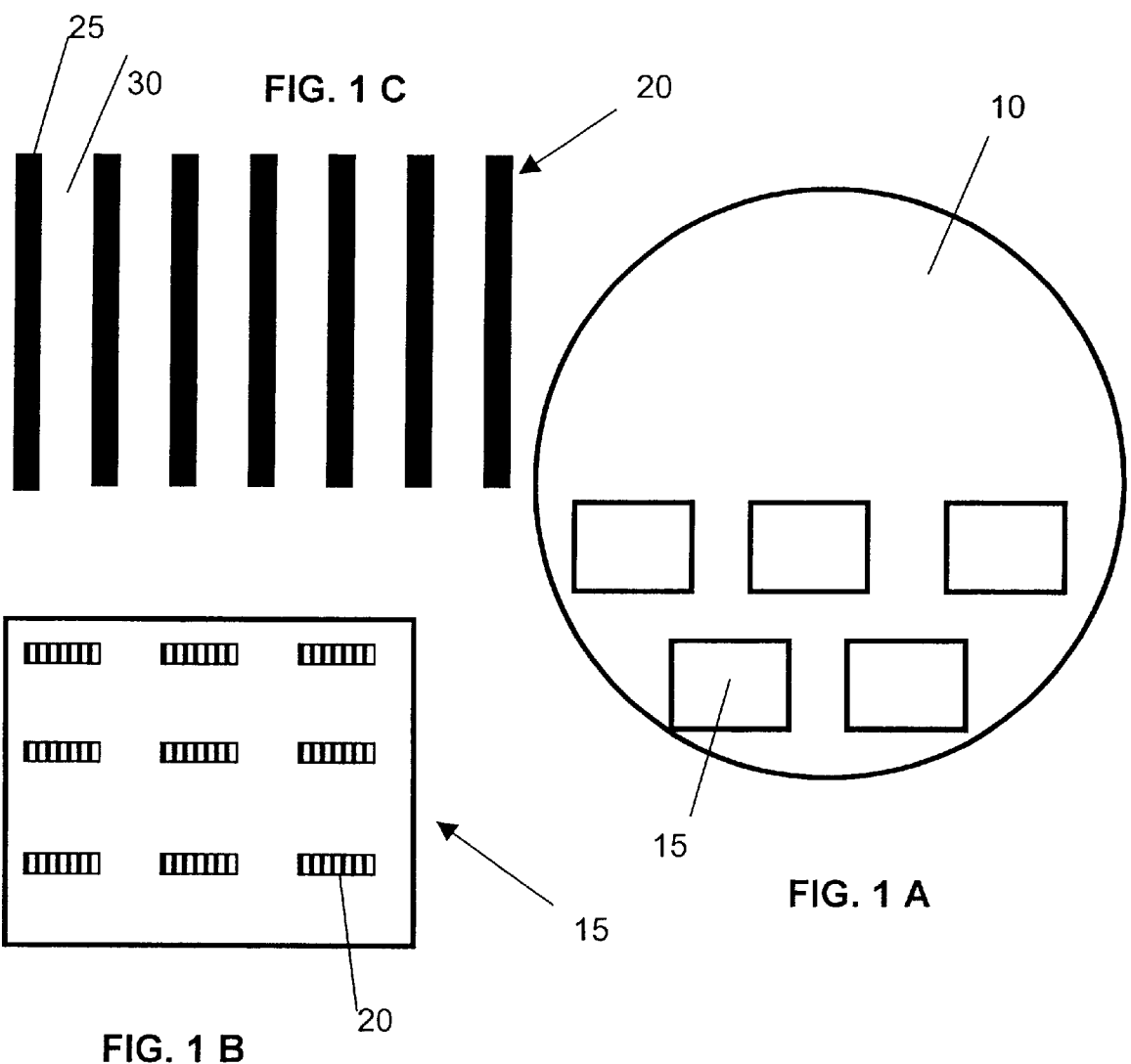

The present invention provides methods and devices for measuring parameters relating to a lithography device, and in a preferred embodiment, for determining the center of focus of a lithography device. In the methods, a series of diffraction signatures of different diffraction gratings are obtained, the diffraction gratings having been made utilizing the lithography device, and made employing a plurality of different focus settings, and optionally a plurality of different dose settings. The diffraction signatures are sequentially ordered, which ordering may be done subsequent to obtaining the diffraction signatures, such as in order of increase or decrease of focus setting, preferably in an equal increments, and the differences between diffraction signatures of adjacent focus setting diffraction gratings are determined. The differences are compared, optionally utilizing a metric such as a root mean square error method of analysis. The diffraction signatures will become closer together, with less difference between equal increment adjacent focus settings, as the center of focus is reached. Thus by employing the method of diffraction signature difference analysis of this invention, the center of focus and related parameters can be determined without reference to a theoretical model or database of historical data, and without use of direct measurement metrology devices, such as an optical microscope or SEM.

Before proceeding to further describe the invention, the following definitions are given.

A lithography device refers to any device that utilizes an image, such as a mask, to transfer a pattern to and optionally into a substrate. This thus includes conventional optical lithography, such as photoresist lithography, but also includes other methods of lithography. In photoresist lithography, also called photolithography, optical methods are used to transfer circuit patterns from master images, called masks or reticles, to wafers. In this process, one or more specialized materials called resists are coated on the wafers on which the circuits are to be made. A resist coat is applied as required, and as required the wafer is further processed, such as by a softbake. Either positive or negative photoresist materials may be employed. Positive resists are normally insoluble in chemicals used as resist developers, but become soluble by exposure to light. Negative resists are normally soluble in chemicals used as resist developers, but become insoluble by exposure to light. By exposing the resist selectively in some areas but not others, the pattern of the circuit or other structure is created in the resist film. In optical lithography, the selective exposure is accomplished by imaging of a mask, typically by shining light onto the mask and projecting the transmitted image onto the resist film.

The lithography devices referenced in this invention include steppers, also known as wafer steppers, which are used to project the image of a circuit or other structure from a photomask onto a resist-coated wafer. A stepper typically includes reduction lens and illuminator, excimer laser light source, wafer stage, reticle stage, wafer cassettes and an operator workstation. Steppers employ both positive and negative resist methods, and utilize either a step-and-repeat format or a step-and-scan format, or combination thereof.

Figure 3:
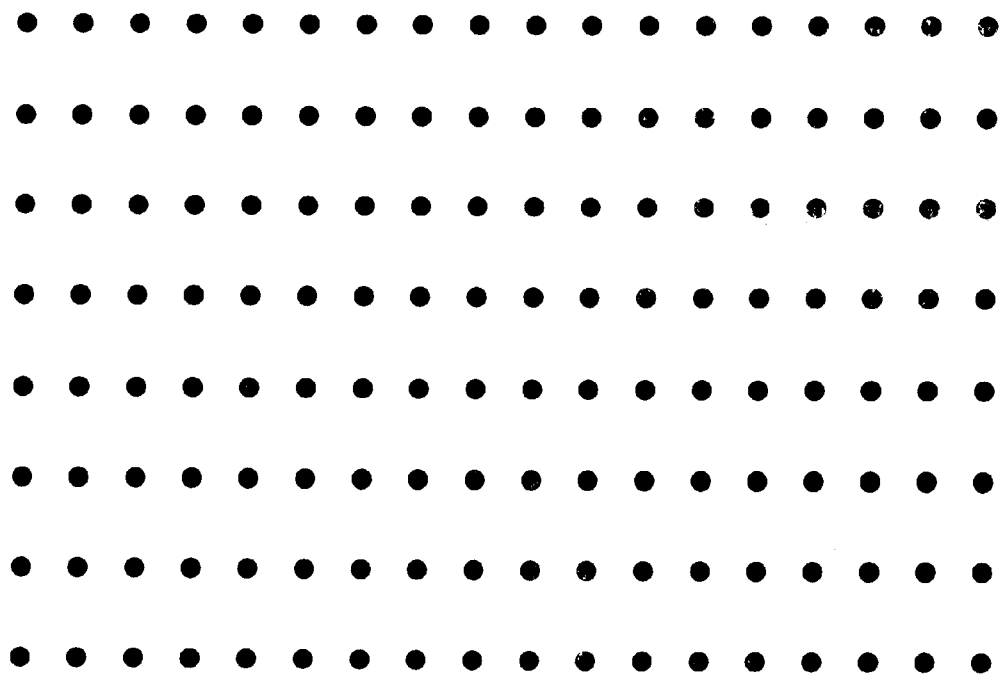
FIG. 3 depicts a three-dimensional diffraction grating.

There is employed in the practice of this invention a wafer or other substrate on which is posited a series of diffraction gratings by means of a lithographic device. In its simplest terms, a diffraction grating is any structure or image made by lithographic means which generates a periodic variation of the refractive index relative to an incident illumination. This change in refractive index can be either due to a physical difference or a chemical difference. Physical differences include photoresist or other lithographically generated changes, such as utilizing a material with one refractive index coupled with air, such as ordinary scored optical diffraction gratings, or a material coupled with a different material. Chemical differences include wafers with photoresist exposed diffraction gratings, where the resist has not yet been developed. In this case all of the resist is still present, but the portions that have been exposed have a different refractive index than the non-exposed resist portions, thereby creating a diffraction grating consisting of periodic variations of refractive index in the resist. The periodic difference is obtained by the periodicity of structural or chemical elements. This thus includes conventional diffraction gratings consisting of a series of parallel lines, but also includes gratings such as a three-dimensional array of posts or holes, wherein there is periodicity in both in the X direction and Y direction. A diffraction grating with periodicity in both the X and Y directions is shown in FIG. 3, and a diffraction grating with periodicity in one direction, consisting of parallel lines 25, is shown in FIG. 1C. Diffraction gratings thus include photoresist gratings, etched film stack gratings, metal gratings and other gratings known in the art. A diffraction grating typically has a line width to space ratio of between about 1:1 to 1:3, though other ratios may be employed. A typical diffraction grating, at for example a 1:3 ratio, could have a 100 nm line width and a pitch of 400 nm. The width and pitch can be significantly smaller, depending in part on the resolution of the lithographic device.

Figure 2:
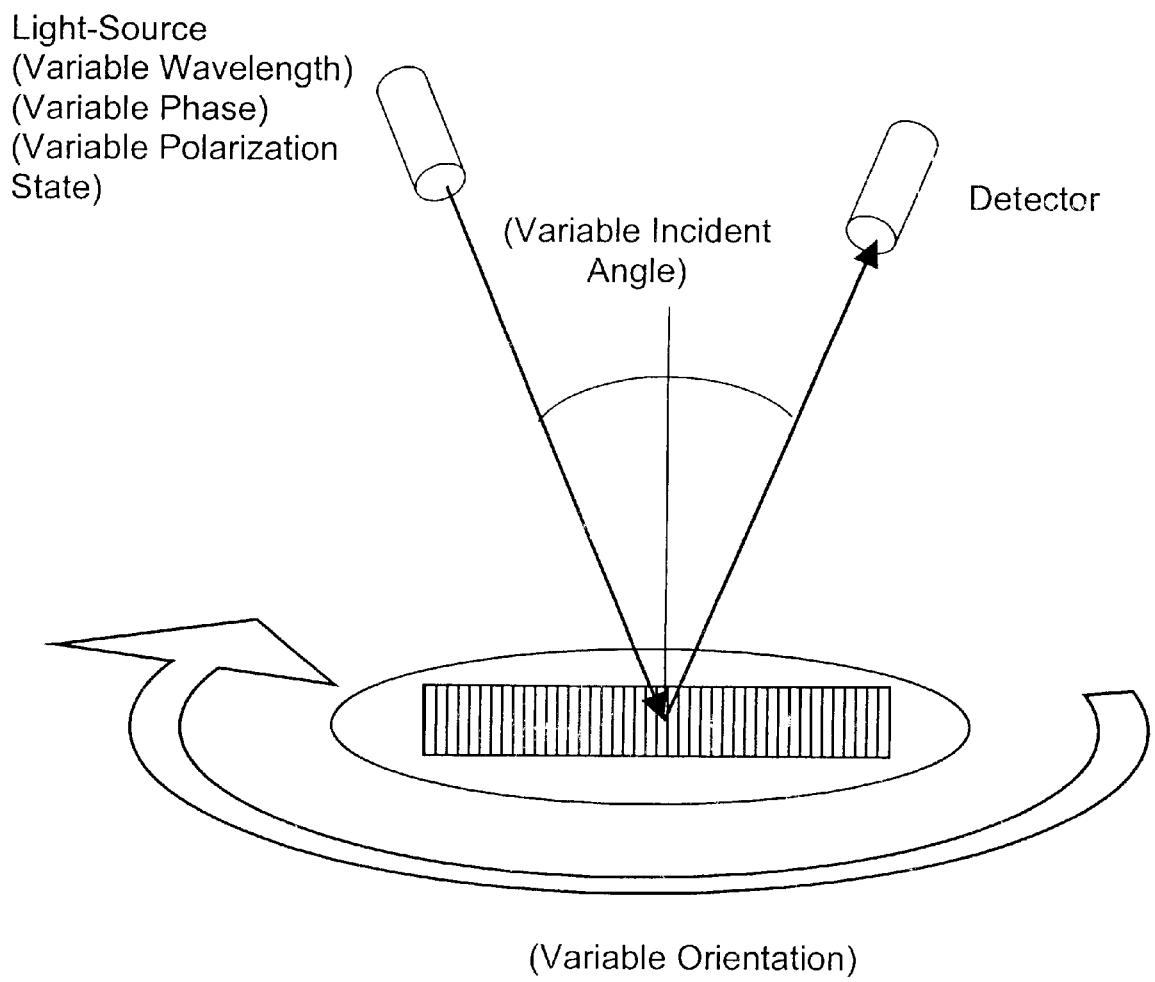
FIG. 2 is a schematic representation of various modes of obtaining a reflective $0^{th}$ order diffraction signature.
Figure 5:
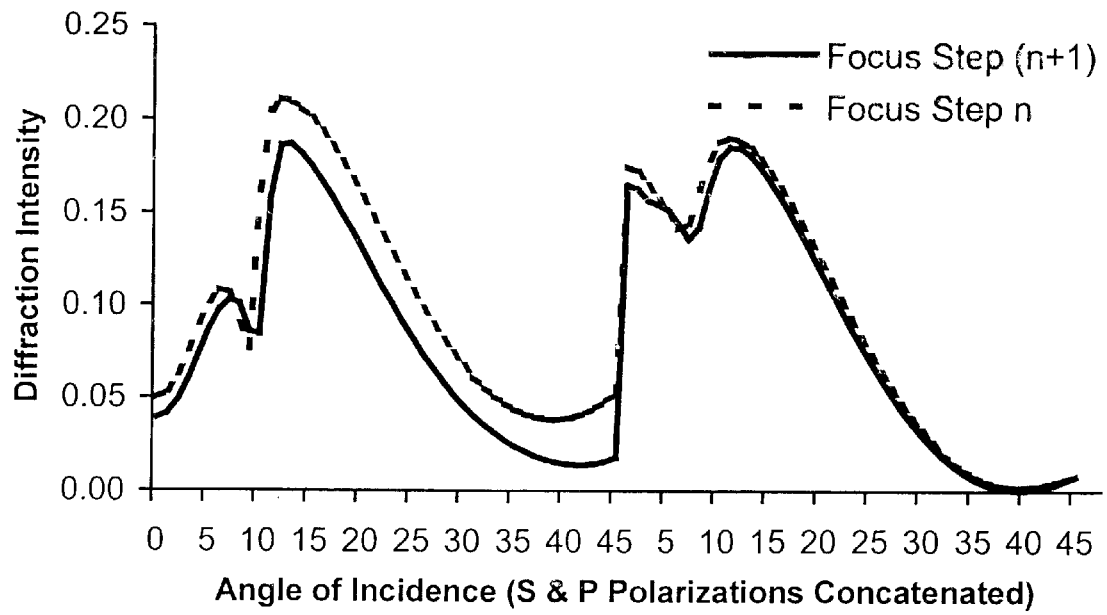
FIGS. 5A–C depict a series of plotted diffraction signatures obtained utilizing an angle-resolved scatterometer, each signature varying by one focus step, with the S and P polarizations concatenated.
Figure 5:
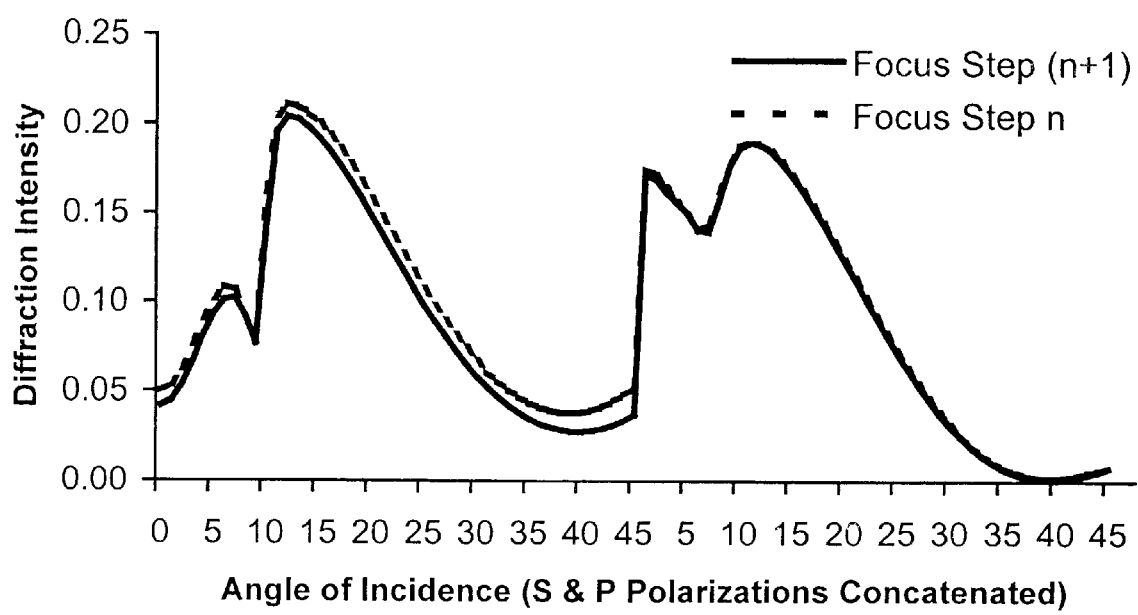
Figure 5:
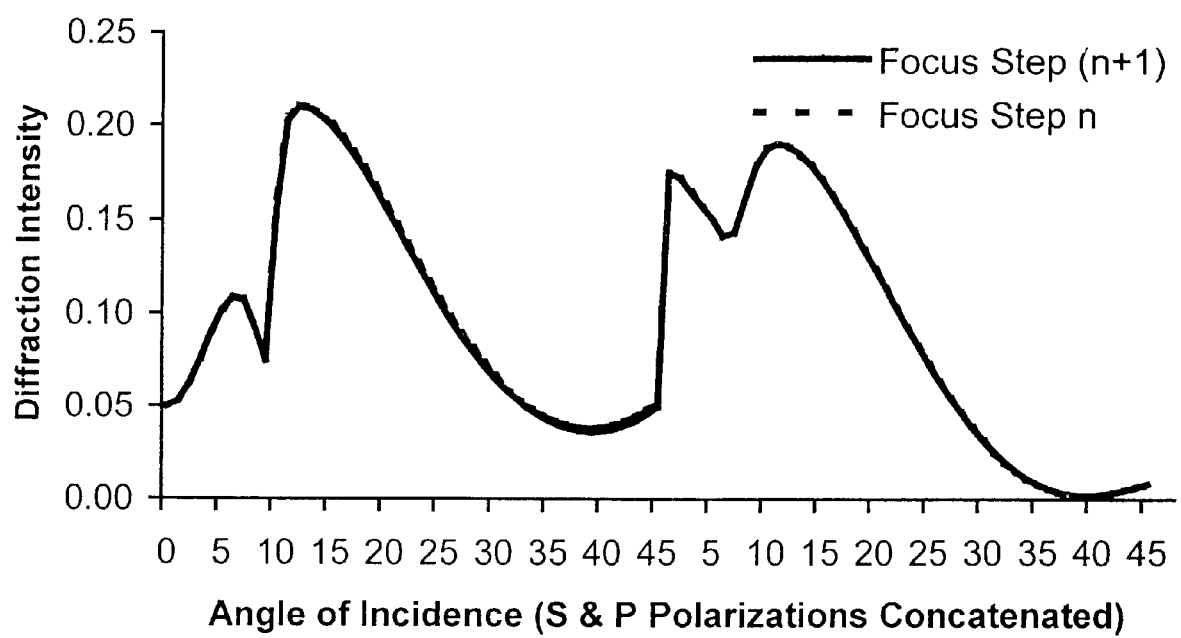

In the practice of this invention, a diffraction grating is used to generate a diffraction signature. A diffraction signature can be generated by any of a number of instruments, such as scatterometers, ellipsometers or reflectometers. Any device employing radiation to generate a diffraction signature is referred to herein as a radiation source-based tool. Typically a visible radiation source-based tool, such as a light source-based tool, is employed, but the radiation source may be other than visible radiation, such as an X-ray source. These devices generate a diffraction pattern or signature by changing at least one diffraction-associated parameter. In one embodiment, the diffraction signature is created by a reflective mode, wherein the radiation, such as light, is reflected. Thus a diffraction signature may be generated by means of an angle-resolved scatterometer, wherein a single known wave-length source is used, and the incident angle Θ is varied over a determined continuous range, as shown in FIG. 2. The resulting diffraction signature is shown in FIG. 5, wherein the intensity of light is plotted against the incident and reflective angle Θ. In another method, a number of laser beam sources are employed, optionally each at a different incident angle Θ. In yet another method, an incident broad spectral light source is used, with the incident light illuminated from some range of wavelengths and the incident angle Θ optionally held constant, as is shown in FIG. 2. Variable phase light sources are also known, utilizing a range of incident phases, with a detector for detecting the resulting diffracted phase, as is shown in FIG. 2. Variable polarization light sources are also known, utilizing a range of polarization from the S to P components or the P to S components. It is also possible to adjust the incident angle over a range Φ, such that the light source rotates about the diffraction grating, or alternatively the diffraction grating is rotated relative to the light source, as shown in FIG. 2. Utilizing any of these various devices, and combinations or permutations thereof, it is possible and known to obtain a diffraction signature for a sample target. In general, the detected light intensity is plotted against the at least one variable parameter, such as angle of incidence Θ, wavelength of incident light, phase of incident light, angle of sweep Φ or the like. The diffraction signature may represent the $0^{th}$ or specular diffraction order, or may represent any higher diffraction order. It is also possible and contemplated that a transmissive mode may be employed to generate a diffraction signature, such as by use of an X-ray radiation source as a component of the radiation source-based tool.

In one embodiment of the invention, a wafer 10 as in FIG. 1 is provided, on which is disposed a series of dies 15. Each die typically represents that portion of the wafer representing the exposure field of the lithographic device, such as a stepper. In a step-and-repeat system, the entire area of the mask or reticle to be exposed is illuminated when the shutter is opened, thereby simultaneously exposing the entire die exposure field. In a step-and-scan system, only a part of the reticle or mask, and thus only a part of the die exposure field, is exposed when the shutter is opened. In either event, the reticle or mask may be moved such that a diffraction grating set 20 is produced, the diffraction grating set 20 being composed of a series of different, optionally different focus, diffraction gratings. It is also possible that the diffraction grating set 20 is composed of a series of the same diffraction gratings, or is composed of a series of same focus but different dose diffraction gratings. In a preferred embodiment, the diffraction grating set 20 is composed of a series of different focus diffraction gratings, preferably varying by a known and incremental focus step, wherein all diffraction gratings are at a fixed dose. From die to die on a wafer 10, either the dose range or focus setting range, or both, may vary. Conventionally, the dose or focus is varied in constant incremental steps, thereby facilitating subsequent analysis. Thus the focus, for example, might vary in 50 to 100 nm steps over a determined range, and the dose, for example, might vary in 1 or 2 mJ increments over a determined range. The diffraction grating 20 may employ conventional lines 25 separated by spaces 30, or may employ a three-dimensional pattern, such as shown in FIG. 3.

The diffraction gratings are typically created in a resist material by preparing masks with opaque and transparent areas corresponding to the desired shape, size and configuration of the desired diffraction grating. A source of radiation is then applied on one side of the mask, thereby projecting the mask shape and spaces onto the resist layer, the resist layer being on the opposite side of the mask. One or more lens or other optical systems may be interposed between the mask and the resist layer, and also optionally between the radiation source and the mask. When exposed to radiation or energized at sufficient levels to effect a change in the resist, a latent image is formed in the resist. The latent images, representing a chemical change in the resist material, result in changes in reflectivity of the resist layer, and thus may be employed to generate a diffraction signature as set forth above. In one embodiment, the wafer with latent images in the resist may be subjected to a post-exposure bake, used to drive additional chemical reactions or to diffuse components within the resist layer. In yet another embodiment, the resist may be developed by a development process, optionally a chemical development process, whereby a portion of the resist is removed, the portion determined by whether a positive resist or negative resist was employed. The development process is also referred to as an etching process, resulting in etched areas or spaces of the resist layer, and optionally the substrate material, such as other films, on which such resist layer is posited.

In the methods and devices of this invention, the diffraction grating may be exposed but not developed, or may alternatively be developed. Similarly, while the foregoing generally describes a conventional method of generating a diffraction grating, any method may be employed, including use of phase shift masks, any of a variety of sources of radiation, including electron beam exposure, and the like.

Focus is a critical parameter in any lithography device, including a stepper or similar lithography device. Focus and depth-of-focus are functions of dose, or quanta of radiation energy, and focus, or distance from the lens to the target. The resulting imaging must be good for all points within a given exposure field, thereby resulting in a definable usable depth-of-focus. However, factors other than dose and focus affect the focus and depth-of-focus, including astigmatism, field curvature, lens quality, orientation of the wafer stage in the x- and y-axes, and the like. Typical production wafer steppers have a resolution of from about 0.15 to about 1.25 microns, and a usable depth-of-focus of from about 0.40 to about 1.50 microns.

Determination of the center of focus for a fixed dose is thus critical in efficient operation of a lithography device, such as for a stepper during the photoresist exposure step in wafer processing. Dose variations compound the difficulty in determining this center. The lenses that are used in steppers and other lithographic devices have a very limited depth of focus, so utmost precision is necessary. Lenses that are in focus will yield sharply printed photoresist images, and lack of focus will result in non-functional photoresist features. Being at the center of focus also significantly improves process repeatability. Once the center of focus is known and determined, any of a variety of different auto-focus systems or schemes may be employed for determining that the separation between the lens and the wafer is held constant. These systems include optical methods, such as employing reflected light, capacitance methods and pressure sensor methods, such as employing pressurized air. However, these systems and schemes are incapable of determining center of focus, but simply maintain the lens-to-wafer distance at a constant. In typical operations, the center of focus must be determined periodically, as often every six hours or less of operation of a lithography device.

Turning to FIG. 5A, depicted therein are two diffraction signatures generated utilizing an angle-resolved scatterometry light radiation source-based tool, the diffraction signatures representing the specular order from one focus step to the next focus step (focus step n and n+1). In each of the figures of FIG. 5, a constant dose was employed in photoresist exposure of the diffraction grating, with the focus, or distance from the lens to the wafer, varied in incremental focus steps. The resulting diffraction signatures are obtained either following photoresist exposure but subsequent to development, or subsequent to development wherein the structure is etched into the resist layer and optionally the substrate including a portion of the wafer. A series of diffraction gratings is measured, and the resulting diffraction signatures recorded, such as in the memory of a processor-associated device. The diffraction grating is any structure employing a repeating or periodic feature capable of diffracting light, including but not limited to the structures of FIGS. 1 and 3. The differences in diffraction signatures of the specular order, or any higher diffraction order, are analyzed by measuring the differences in diffraction signatures from one focus step to the next. The difference in diffraction signatures from one focus step to the next will become less and less as the center of focus is approached. Under theoretically ideal conditions, the center of focus is the point as which variation in diffraction signatures are at minima. Thus, as is shown in FIG. 5, the distance separating the diffraction signatures of adjacent focus step diffraction gratings decreases as the center of focus is approached, such that in FIG. 5C the two resulting diffraction signatures are virtually superimposable, with no significant difference therebetween.

The difference in diffraction signatures from one focus step to the next, and the determination of the center of focus, may be ascertained by visually comparing the resulting adjacent focus step diffraction signatures, as depicted in FIG. 5. However, this method requires operator judgment and is not directly quantifiable, and is also comparatively slow. Accordingly, any of a variety of metrics or methods of analysis may be employed to measuring the differences in diffraction signatures from one focus step to the next. Such methods include, but are not limited to, minimizing the mean square error (MSE) or root mean square error (RMSE), and other Euclidean distance measures. Such methods also include averaging, weighted averaging, sum of averages and other methods to characterize the difference in diffraction signatures.

Figure 4:
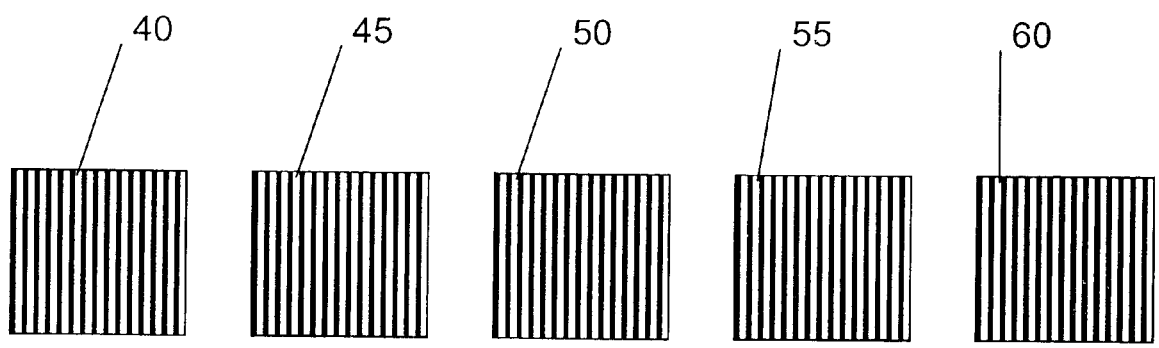
FIG. 4 depicts a series of diffraction gratings.

In one embodiment, diffraction signatures are obtained from a series of sequential different focus setting diffraction gratings 40, 45, 50, 55, and 60 as shown in FIG. 4. The RMSE difference between 40 and 45 is determined, and represents the diffraction signature difference for diffraction grating 40 at its corresponding focus setting. The average of the RMSE difference between 40 and 45 and between 45 and 50 is determined, and represents the diffraction signature difference for diffraction grating 45 at its corresponding focus setting. The average of the RMSE difference between 45 and 50 and between 50 and 55 is determined, and represents the diffraction signature difference for diffraction grating 50 at its corresponding focus setting. Similarly the average of the RMSE difference between 50 and 55 and between 55 and 60 is determined, and represents the diffraction signature difference for diffraction grating 55 at its corresponding focus setting. The RMSE difference between 55 and 60 is employed as the diffraction signature difference for diffraction grating 60 at its corresponding focus setting. This thus generates a series of diffraction signatures differences corresponding to the difference in focus settings between ordered different focus diffraction gratings.

Once obtained, the difference in diffraction signatures may be used to determine center of focus by means of a weighted average determination. In one such embodiment, the center of focus can be determined by means of the following equation (1):

$$COF = \frac{\sum \frac{(Focus\ Step)}{(DSD_{RMSE})^2}}{\sum \frac{1}{(DSD_{RMSE})^2}} \quad (1)$$

where COF is the center of focus and $DSD_{RMSE}$ is the RMSE diffraction signature difference (DSD).

Figure 6:
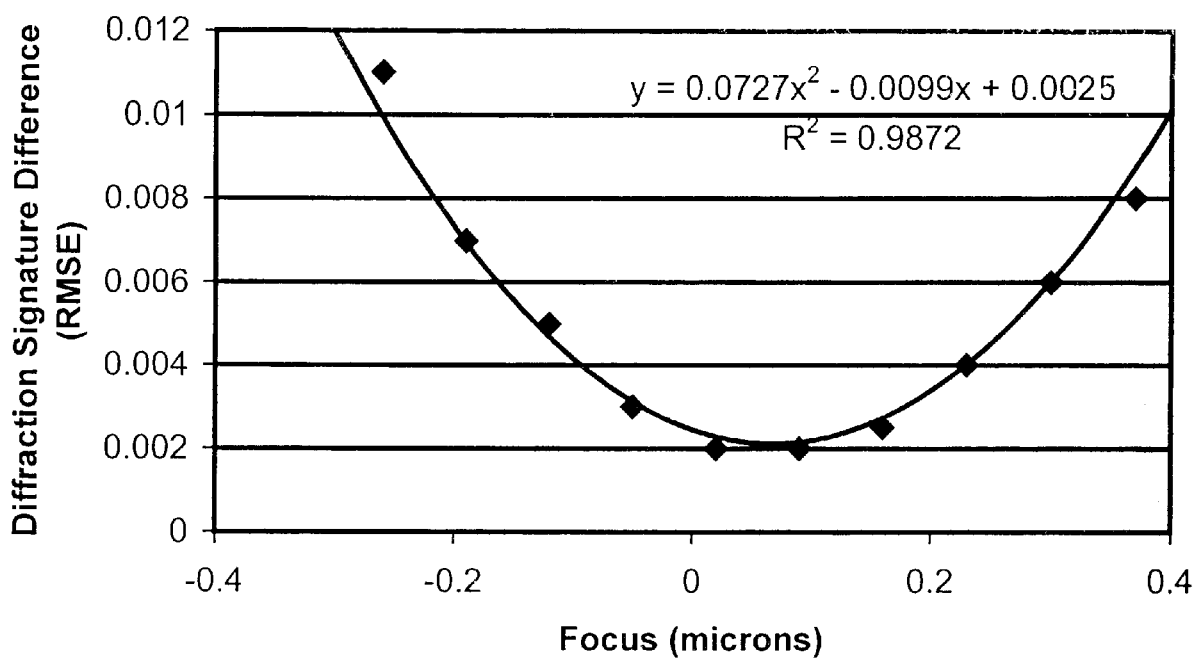
FIG. 6 is a plot of diffraction signature difference determined by root mean square error plotted against focus.

The numerical representation of the differences in diffraction signatures may be also compared by other means to determine the center of focus as the focus setting corresponding to the region with the minima difference between adjacent focus setting diffraction gratings. The numerical representation may be plotted against the focus setting steps, thereby resulting in a plot as in FIG. 6, depicting a parabolic curve centered about the center of focus. At the center of focus, the slope of the parabolic curve is at or approximates zero, this locus further representing the area of minimal difference between the diffraction signatures for adjacent different focus setting diffraction gratings.

Any of a variety of filters and related mathematical models may be employed to discard outliers prior to determination of the center of focus. Particularly with diffraction gratings exposed at a focus setting substantially out of focus, the resulting focus curve may become erratic. Individual diffraction gratings may further yield aberrant results for reasons unrelated to the focus setting, such as exposure errors, resist defects and the like.

Figure 7A:
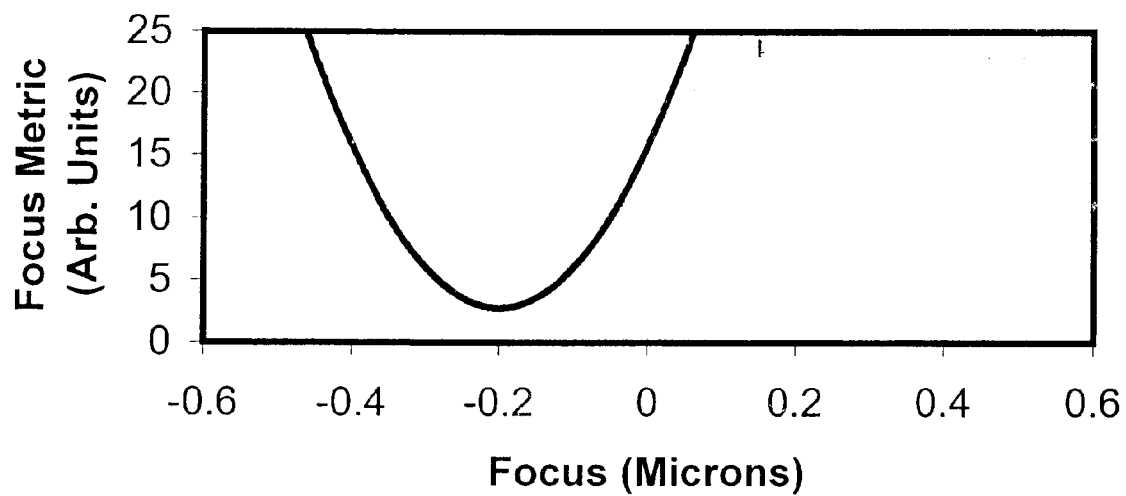
FIGS. 7A and B depict plots of parabolic curves encompassing the minima for narrow and wide range centers of focus, respectively.
Figure 7:
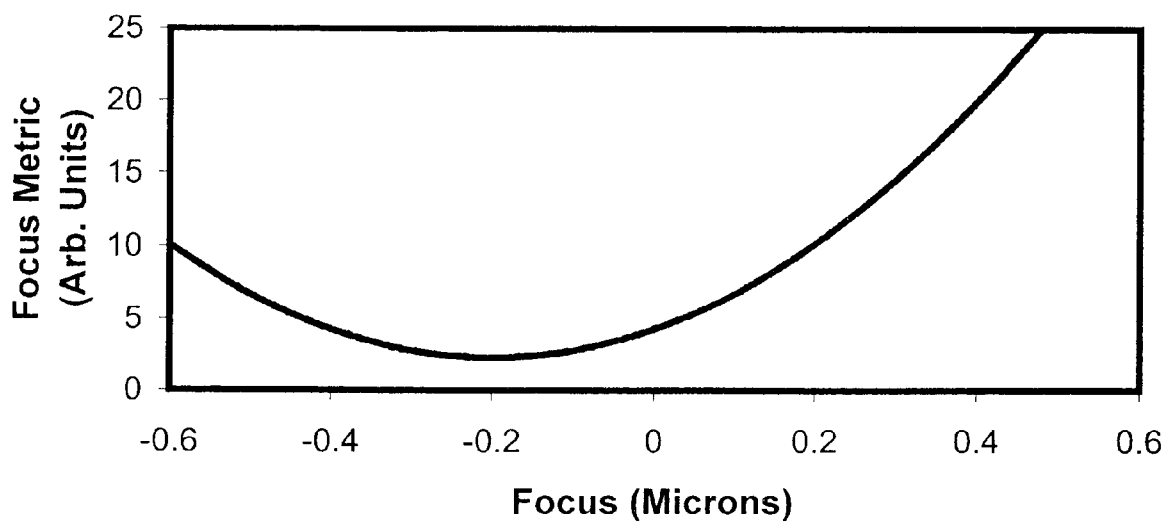

The depth-of-focus or robustness of a given lithography device, such as a stepper, may be quantitated by analysis of the resulting parabolic curve. If the plotted function has a very tight parabola, as shown in FIG. 7A, then the depth-of-focus is correspondingly small, since the area encompassing the minima corresponds to a small series of focus settings. If the plotted function has a broad parabola, as shown in FIG. 7B, depicting a large area corresponding to the minima, then the depth-of-focus is larger, permitting a good focus value for a variety of settings.

For a parabolic response to be obtained, the center of focus must be included within the series of incremental focus settings utilized to expose the diffraction grating. That is, no parabolic curve with a zero slope at the center of focus can be generated where the range does not encompass the center of focus. Further, at points significantly out of focus, for example where sequential focus steps are completely removing resist, then diffraction signatures from one focus step to the next focus step may be very close. This is a function of the difference in focus steps not resulting in any significant difference in the resulting images. Here too a grating model or uniform film model may be employed to determine areas that are significantly out of focus. Typically such points cannot be plotted to a parabolic curve.

While the example of FIG. 5 shows a comparison of different focus diffraction signatures as a function of the angle of incidence, with both S and P polarizations concatenated and plotted against the diffraction intensity, it can readily be appreciated that in other modes of diffraction the diffraction signature can similarly be plotted. Thus for variable wavelength diffraction the diffraction signature is generated by plotting wavelength against intensity, for variable phase diffraction by plotting phase against intensity, for variable polarization state diffraction by plotting polarization state against intensity, for variable orientation diffraction by plotting $\Phi$ against intensity and the like. Similarly, while the diffraction signatures of FIG. 5 result from reflective diffraction, similar diffraction signatures may be obtained by means of transmissive diffraction, provided only that the radiation source-based tool utilized for diffraction can be transmitted through at least a portion of the diffraction grating, such as may be obtained by using an X-ray radiation source-based tool, or for a light source-based tool, by means of a transparent or semi-transparent diffraction grating and substrate. FIG. 5 depicts the $0^{th}$ or specular order diffraction, but similar results may be obtained by means of any higher diffraction order, it being understood that for most embodiments the diffraction signatures from the same diffraction order are most conveniently compared.

In generating a plot as shown in FIG. 6, or in generating a center of focus as shown in equation (1), it is understood that various statistical techniques can be used to interpolate between measured focus points to give a more precise measurement of center of focus. These methods are known in the art, and may be conventionally employed. Similarly, analysis means can be employed which do not use each focus point, but rather perform an initial analysis based on the diffraction signature difference across multiple focus settings. It is preferred that the incremental difference between focus setting steps be held constant, but it is also contemplated that interpolation means can be employed where the focus setting steps are not uniform.

Utilizing the methods of this invention, the differences in the center of focus are typically less than 0.03 microns, which is below a typical focus step size of 0.07 microns. This thus permits focusing within the resolution of the lithography device, such as a stepper.

The effect of dose on the center of focus may be analyzed in a similar means. A series of diffraction grating sets, such as diffraction grating sets 20, are generated over a determined different focus range encompassing the center of focus, with the dose varied in stepwise fashion from grating set to grating set. The result is a series of diffraction grating sets each at a different and known dose. A series of diffraction signatures are then obtained for each diffraction grating set, by means of a radiation source-based tool as set forth above. The resulting series of diffraction signatures can be analyzed as above, such as by diffraction signature difference analysis. The resulting center of focus can be plotted against dose, thereby yielding the effect of dose on the center of focus. By this means the dose setting or settings with the most robust focus curves can be ascertained, such that a dose setting with a minimum impact on the focus curve or depth-of-focus can be selected.

Figure 8:
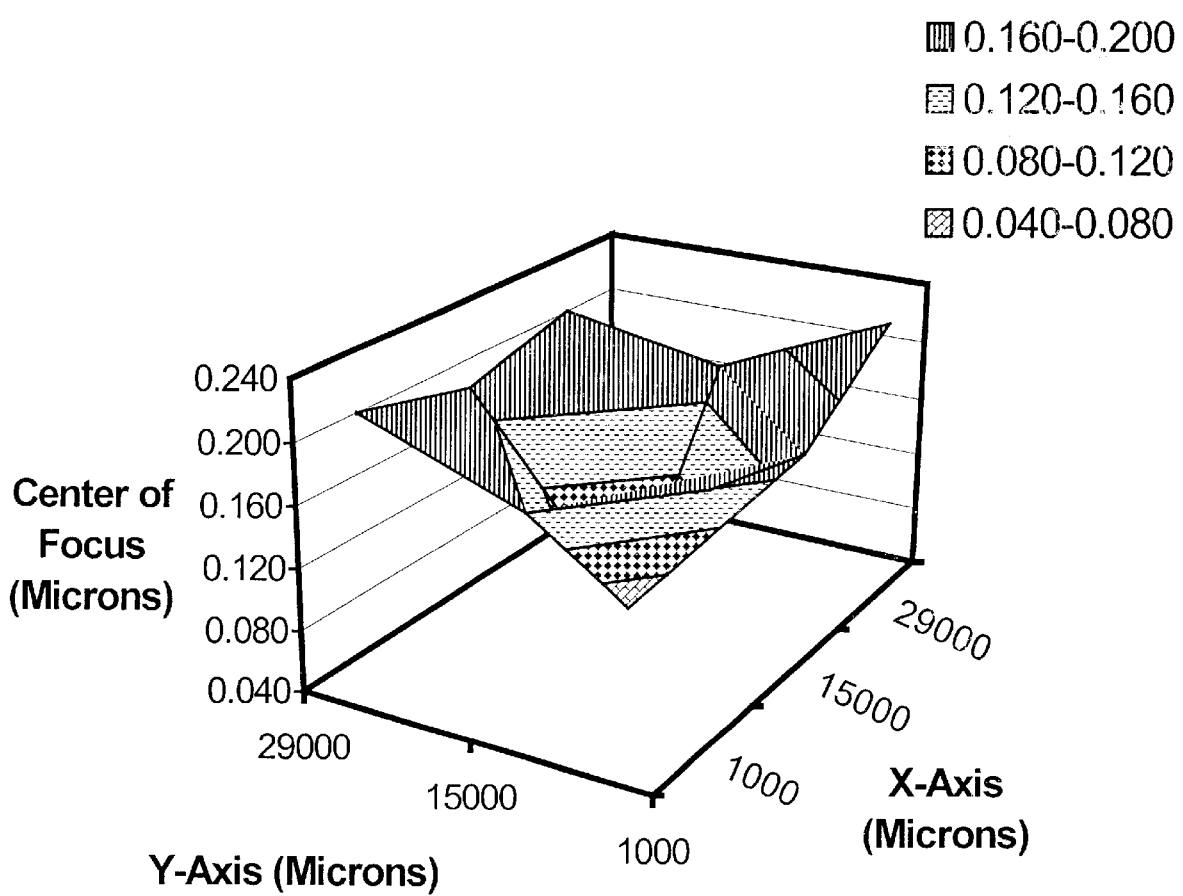
FIG. 8 depicts a three-dimensional plot of the center of focus derived from diffraction signature difference at a multitude of positions in the field, thereby showing the center of focus as a function of position in the field.
Figure 9:
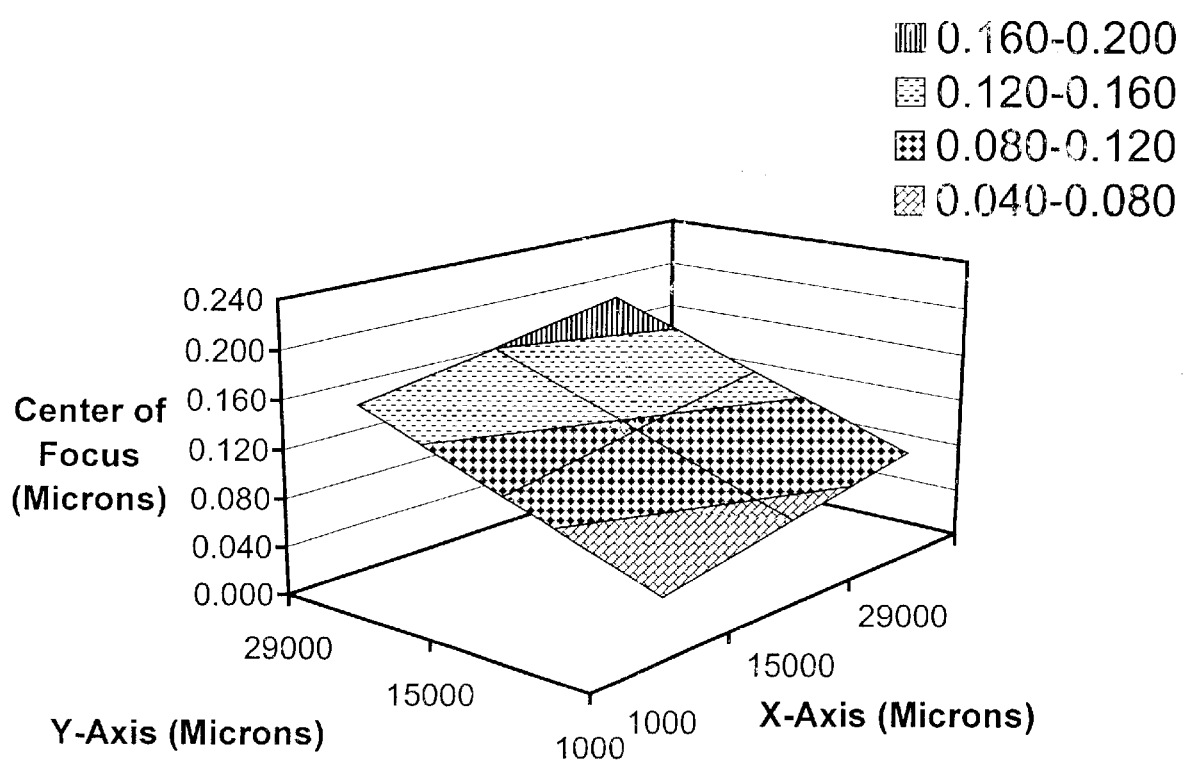
FIG. 9 depicts a three-dimensional plot of the center of focus derived from diffraction signature difference over the tilt in the field, thereby showing the stage tilt effects of the center of focus as a function of position in the field.

It is further readily apparent that utilizing the diffraction signature difference, such as shown in FIG. 6, and data as to the location of the diffraction grating in the field, which field may conventionally be a wafer stage, that the center of focus as a function of position in the field may be plotted, as shown in FIG. 8. Such plot may reveal aberrations in the lens system, astigmatism, or other defects causing the center of focus over the field to be non-uniform. Similarly, as shown in FIG. 9, tilt in the field over both the x- and y-axes may be plotted, thereby showing the stage tilt effects of the center of focus as a function of position in the field.

Utilizing the methods and devices of this invention, it is also possible to match the signatures at the center of focus as determined by diffraction signature difference to a known library of theoretical or actual diffraction signature differences. Such match library can be significantly smaller than a conventional theoretical library, which necessarily encompasses a wide range of out-of-focus settings, thereby permitting more rapid library generation, in the case of a theoretical library, smaller storage requirements for the library, and a faster analysis time.

The methods and devices of this invention may also be used for quality control testing, including analysis of the center of focus determined by other means. This may be done in conjunction with an angle-resolved scatterometer, described above, including its associated computer system, or with other suitable devices capable of making the described measurements.

By means of employing an angle-resolved scatterometer, the diffraction signature is separated into distinct diffraction orders at angular locations specified by the grating equation (2):

$$\sin\Theta_i + \sin\Theta_n = n\lambda/d \tag{2}$$

where $\Theta_i$ is the angle of incidence, taken as negative, $\Theta_n$ is the angular location of the nth diffraction order, $\lambda$ is the wavelength of incident light and d is the spatial period or pitch of the diffraction grating. It can thus be seen that for the $0^{th}$ or specular diffraction order, the angle of incidence is equal to the angular location of the specular diffraction order. However, diffraction orders other than the specular may be employed, and the appropriate angular location determined as set forth above. Similar relationships govern other modes of generating diffraction signatures, so that with any mode of generating a diffraction signature either the specular diffraction order or some higher diffraction order may be employed. For example, in a wavelength resolve device, the angle $\Theta_i$ may be held constant and the wavelength $\lambda$ varied, and the equation solved for $\Theta_n$ at a given n.

The methods and devices of this invention may also be used for determination of the center of focus, whereby the center of focus is adjusted by any suitable means, including use of computer-based control systems, and the methods of this invention used to determine when an acceptable or optimal focus has been determined. The adjustment may be done by dose variations, or by other means known in the art.

The invention may be further used for automatic or automated determination of the center of focus, utilizing an autofocus control system, whereby information as to the diffraction signature analysis is used in a control system to determine the focus, such as by dose variations.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of measuring parameters relating to a lithography device comprising the steps of:

providing a substrate comprising a plurality of diffraction gratings formed on the substrate by lithographic process utilizing the lithography device, the diffraction gratings comprising a plurality of spaced elements;

measuring a diffraction signature for at least three of the plurality of diffraction gratings by means of a radiation source-based tool; and determining the differences between the diffraction signatures to determine a desired parameter of said lithography device.

2. The method of claim 1 wherein the substrate comprises a wafer.

3. The method of claim 1, wherein the radiation source-based tool comprises a light source-based tool.

4. The method of claim 3, wherein the light source-based tool comprises an incident laser beam source, an optical system focusing the laser beam and scanning through some range of incident angles, and a detector for detecting the resulting diffraction signature over the resulting measurement angles.

5. The method of claim 4, wherein the light source-based tool comprises an angle-resolved scatterometer.

6. The method of claim 3, wherein the light source-based tool comprises a plurality of laser beam sources.

7. The method of claim 3, wherein the light source-based tool comprises an incident broad spectral light source, an optical system focusing the light and illuminating through some range of incident wavelengths, and a detector for detecting the resulting diffraction signature over the resulting measurement wavelengths.

8. The method of claim 3, wherein the light source-based tool comprises an incident light source, components for varying the amplitude and phase of the S and P polarizations, an optical system focusing the light and illuminating over some range of incident phases, and a detector for detecting the phase of the resulting diffraction signature.

9. The method of claim 1, wherein measuring a diffraction signature comprises phase measurement by means of a broad spectral radiation source-based tool source, operating at a fixed angle, a variable angle $\Theta$ or a variable angle $\Phi$.

10. The method of claim 1, wherein measuring a diffraction signature comprises phase measurement by means of a single wavelength radiation source-based tool source, operating at a fixed angle, a variable angle $\Theta$ or a variable angle $\Phi$.

11. The method of claim 1, wherein measuring a diffraction signature comprises phase measurement by means of a multiple discrete wavelength radiation source-based tool source.

12. The method of claim 1, wherein the diffraction signature is a reflective diffraction signature.

13. The method of claim 1, wherein the diffraction signature is a transmissive diffraction signature.

14. The method of claim 1, wherein the diffraction signature is a specular order diffraction signature.

15. The method of claim 1, wherein the diffraction signature is a higher order diffraction signature.

16. The method of claim 1, the method further comprising forming the plurality of diffraction gratings utilizing the lithography device at known different focus settings, and determining the two adjacent focus setting diffraction gratings wherein the difference between the diffraction signatures is less than the difference of the diffraction signatures between other adjacent focus setting diffraction gratings, whereby the parameter is the center of focus of the lithography device.

17. The method of claim 16, wherein the known different focus settings are equal increment different focus settings.

18. The method of claim 16, wherein the known different focus settings are non-equal increment different focus settings, and the method further comprises use of a mathematical algorithm to normalize the non-equal increment different focus settings.

19. The method of claim 16, wherein the difference in diffraction signatures between diffraction gratings increases as an approximation of a parabolic curve with a slope of zero over the center of focus.

20. The method of claim 1, wherein determining the difference in diffraction signatures between diffraction gratings comprises determination of the difference using a metric.

21. The method of claim 20, wherein the metric is a root mean square error method of data analysis.

22. The method of claim 1, wherein determining the minimal difference comprises comparing the weighted averages of differences between diffraction signatures between diffraction gratings.

23. The method of claim 1, the method further comprising forming the plurality of diffraction gratings utilizing the lithography device at the same focus setting and determining the differences as a function of the location of the diffraction gratings on the substrate.

24. The method of claim 1, the method further comprising forming the plurality of diffraction gratings at known different focus settings and known different dose settings and determining the effect of dose on focus.

25. The method of claim 23, wherein the plurality of diffraction gratings comprise sets of the same known different focus setting diffraction gratings, the sets varying by different known dose settings.

26. A method of determining the center of focus in a lithography device, comprising the steps of providing a substrate comprising a plurality of diffraction gratings made utilizing the lithography device, the plurality of diffraction gratings comprising different known focus settings;

determining a diffraction signature for at least three of the plurality of diffraction gratings by means of a radiation source-based tool;

measuring the differences between the diffraction signatures between adjacent focus setting diffraction gratings; and determining the center of focus as the focus setting wherein there is a minimal difference between the diffraction signatures of adjacent focus setting diffraction gratings.

27. The method of claim 26, wherein the difference in diffraction signatures between adjacent focus setting diffraction gratings increases as an approximation of a parabolic curve with a slope of zero on the minimal difference.

28. The method of claim 26, wherein determining the difference in diffraction signatures between adjacent focus setting diffraction gratings comprises determination of the difference using a metric.

29. The method of claim 28, wherein the metric is a root mean square error method of data analysis.

30. The method of claim 26, wherein determining the minimal difference comprises comparing the weighted averages of differences between diffraction signatures between adjacent focus setting diffraction gratings.

31. The method of claim 26, wherein determining the minimal difference comprises fitting data derived from differences between diffraction signatures between adjacent sequential focus setting diffraction gratings to a parabolic curve, whereby the minimal difference encompasses the minima of the parabolic curve.

32. The method of claim 26 wherein the substrate comprises a wafer.

33. The method of claim 26, wherein the radiation source-based tool comprises a light source-based tool.

34. The method of claim 33, wherein the light source-based tool comprises an incident laser beam source, an optical system focusing the laser beam and scanning through some range of incident angles, and a detector for detecting the resulting diffraction signature over the resulting measurement angles.

35. The method of claim 34, wherein the light source-based tool comprises an angle-resolved scatterometer.

36. The method of claim 33, wherein the light source-based tool comprises a plurality of laser beam sources.

37. The method of claim 33, wherein the light source-based tool comprises an incident broad spectral light source, an optical system focusing the light and illuminating through some range of incident wavelengths, and a detector for detecting the resulting diffraction signature over the resulting measurement wavelengths.

38. The method of claim 33, wherein the light source-based tool comprises an incident light source, components for varying the amplitude and phase of the S and P polarizations, an optical system focusing the light and illuminating over some range of incident phases, and a detector for detecting the phase of the resulting diffraction signature.

39. The method of claim 26, wherein measuring a diffraction signature comprises phase measurement by means of a broad spectral radiation source-based tool source, operating at a fixed angle, a variable angle $\Theta$ or a variable angle $\Phi$.

40. The method of claim 26, wherein measuring a diffraction signature comprises phase measurement by means of a single wavelength radiation source-based tool source, operating at a fixed angle, a variable angle Θ or a variable angle Φ.

41. The method of claim 26, wherein measuring a diffraction signature comprises phase measurement by means of a multiple discrete wavelength radiation source-based tool source.

42. The method of claim 26, wherein the diffraction signature is a reflective diffraction signature.

43. The method of claim 26, wherein the diffraction signature is a transmissive diffraction signature.

44. The method of claim 26, wherein the diffraction signature is a specular order diffraction signature.

45. The method of claim 26, wherein the diffraction signature is a higher order diffraction signature.

46. The method of claim 26, wherein the different focus settings comprise a constant difference between sequential different focus settings.

47. The method of claim 26, wherein the different known focus settings are non-equal increment different focus settings, and the method further comprises use of a mathematical algorithm to normalize the non-equal increment different focus settings.

* * * * *